US012684995B2

(12) United States Patent
Chen

(10) Patent No.: US 12,684,995 B2
(45) Date of Patent: Jul. 14, 2026

(54) FLEXIBLE COVER PLATES, MANUFACTURING METHODS THEREOF AND DISPLAY DEVICES

(71) Applicant: WUHAN CHINA STAR OPTOELECTRONICS SEMICONDUCTOR DISPLAY TECHNOLOGY CO., LTD., Wuhan (CN)

(72) Inventor: Yongsheng Chen, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 564 days.

(21) Appl. No.: 18/039,441

(22) PCT Filed: Mar. 24, 2023

(86) PCT No.: PCT/CN2023/083571
§ 371 (c)(1),
(2) Date: May 30, 2023

(87) PCT Pub. No.: WO2024/168983
PCT Pub. Date: Aug. 22, 2024

(65) Prior Publication Data
US 2025/0081813 A1 Mar. 6, 2025

(30) Foreign Application Priority Data
Feb. 17, 2023 (CN) .......................... 202310131830.7

(51) Int. Cl.
*H10K 59/80* (2023.01)
*H10K 102/00* (2023.01)

(52) U.S. Cl.
CPC ..... *H10K 59/873* (2023.02); *H10K 2102/311* (2023.02)

(58) Field of Classification Search
None
See application file for complete search history.

(56) References Cited

U.S. PATENT DOCUMENTS

2017/0373121 A1* 12/2017 Leng ...................... H10K 59/12

FOREIGN PATENT DOCUMENTS

CN 108877529 A 11/2018
CN 208607861 U 3/2019
(Continued)

OTHER PUBLICATIONS

Chinese Office Action issued in corresponding Chinese Patent Application No. 202310131830.7 dated Jul. 23, 2025, pp. 1-9.
(Continued)

*Primary Examiner* — Kyoung Lee
(74) *Attorney, Agent, or Firm* — PV IP PC; Peter Stecher; Wei Te Chung

(57) ABSTRACT

A flexible cover plate, a manufacturing method of the flexible cover plate and a display device is provided by the present disclosure. The flexible cover plate includes at least two substrate layers, and an elastic modulus of the substrate layer close to a bending inner side of the flexible cover plate is greater than the substrate layer away from the bending inner side of the flexible cover plate, which ensures that when the flexible cover plate is bonded to a display panel, the two substrates is correspondingly disposed according to a bending outer side and a bending inner side of the display device, balancing the bending performance and the surface hardness.

20 Claims, 5 Drawing Sheets

1

(56)     References Cited

FOREIGN PATENT DOCUMENTS

| CN | 110164315 | A | 8/2019 |
| CN | 209199986 | U | 8/2019 |
| CN | 111933611 | A | 11/2020 |
| CN | 113542459 | A | 10/2021 |
| CN | 113644217 | A | 11/2021 |
| CN | 115050263 | A | 9/2022 |
| CN | 115050267 | A | 9/2022 |
| WO | 2022183757 | A1 | 9/2022 |

OTHER PUBLICATIONS

International Search Report in International application No. PCT/CN2023/083571, mailed on Oct. 25, 2023.
Written Opinion of the International Search Authority in International application No. PCT/CN2023/083571, mailed on Oct. 25, 2023.

* cited by examiner

1

1

10

10

FLEXIBLE COVER PLATES, MANUFACTURING METHODS THEREOF AND DISPLAY DEVICES

CROSS REFERENCE TO RELATED APPLICATIONS

This application is a continuation of International Application No. PCT/CN2023/083571, filed on Mar. 24, 2023, which claims priority to and the benefit of Chinese Patent Application No. 202310131830.7, filed on Feb. 17, 2023. The disclosures of the aforementioned applications are incorporated herein by reference in their entireties.

TECHNICAL FIELD

The present disclosure relates to a display technical field, and in particular to flexible cover plates, manufacturing methods of the flexible cover plates and display devices.

BACKGROUND

Organic light-emitting diode (OLED) display devices are widely used due to their high brightness, wide viewing angle, fast response speed, ultra-thin thickness, light weight, and flexibility. In order to achieve the flexibility of the OLED display device, in addition to adopting a flexible design for a display panel, it is also necessary to choose a flexible cover plate as the cover plate of the OLED display device. The flexible cover plate in the prior art includes an organic substrate layer and a hardened coating layer. When a thickness of the flexible cover plate is thin, the bending performance of the flexible cover plate is good, but the surface hardness and the impact resistance are poor. When the thickness of the flexible cover plate is thick, the surface hardness and the impact resistance of the flexible cover plate are good, but the bending performance of the flexible cover plate is poor, causing each film layer in the flexible cover plate to break due to excessive internal stress during repeated bending.

Therefore, there is a technical problem that the flexible cover plate in the prior art is uncapable of balancing the bending performance and the surface hardness.

SUMMARY

Technical Problems

The embodiments of the present disclosure provide a flexible cover plate, a manufacturing method of the flexible cover plate and a display device, to alleviate the technical problem of the flexible cover plate in the prior art is uncapable of balancing the bending performance and the surface hardness.

Technical Solutions

To solve the above problem, the technical solutions provided in the present disclosure are as follows.

An embodiment of the present disclosure provides a flexible cover plate, the flexible cover plate is capable of being bent along a bending line. the flexible cover plate includes at least two substrate layers, an elastic modulus of one of two adjacent substrate layers is greater than another one of the two adjacent substrate layers, and repeating structural units of corresponding materials of each substrate layers are same. The one of the two adjacent substrate layers is close to a bending inner side of the flexible cover plate, and the another one of the two adjacent substrate layers is away from the bending inner side of the flexible cover plate.

In some embodiments, a degree of polymerization of a corresponding material of the one of the two adjacent substrate layers is greater than a degree of polymerization of a corresponding material of the another one of the two adjacent substrate layers, the one of the two adjacent substrate layers is close to the bending inner side of the flexible cover plate, and the another one of the two adjacent substrate layers is away from the bending inner side of the flexible cover plate.

In some embodiments, the one of the two adjacent substrate layers is in direct contact with the another one of the two adjacent substrate layers, the one of the two adjacent substrate layers is close to the bending inner side of the flexible cover plate, and the another one of the two adjacent substrate layers is away from the bending inner side of the flexible cover plate.

In some embodiments, when a bending direction of the flexible cover plate is inwardly folded, the flexible cover plate includes a hardened layer, the hardened layer is disposed on a side of the one of the two adjacent substrate layers close to the bending inner side of the flexible cover plate, an elastic modulus of the hardened layer is greater than the elastic modulus of the one of the two adjacent substrate layers, and the one of the two adjacent substrate layers is close to the bending inner side of the flexible cover plate.

In some embodiments, when a bending direction of the flexible cover plate is outwardly folded, the flexible cover plate includes a hardened layer, and the hardened layer is disposed on a side of the another one of the two adjacent substrate layers away from the bending inner side of the flexible cover plate, an elastic modulus of the hardened layer is greater than the elastic modulus of the one of the two adjacent substrate layers, the another one of the two adjacent substrate layers is away from the bending inner side of the flexible cover plate, and the one of the two adjacent substrate layers is close to the bending inner side of the flexible cover plate.

In some embodiments, when the flexible cover plate is in a bent state, an elastic modulus of a plurality layers of the substrate layers increases progressively along a direction from the bending inner side of the flexible cover plate toward a bending outer side of the flexible cover plate.

In some embodiments, a difference between elastic modulus of the two adjacent substrate layers is less than or equal to 100 MPa.

In some embodiments, an elastic modulus of the another one of the two adjacent substrate layers away from the bending inner side of the flexible cover plate is greater than or equal to 4 GPa.

In some embodiments, a thickness of the substrate layer is greater than or equal to 10 microns.

In some embodiments, a thickness of the flexible cover plate ranges from 20 microns to 200 microns.

In addition, an embodiment of the present disclosure provides a manufacturing method of a flexible cover plate, and the manufacturing method of the flexible cover plate is configured to manufacture the flexible cover plate of any one of the above embodiments, and the manufacturing method of the flexible cover plate includes:

putting polyethylene glycol terephthalate particles with different relative molecular mass into different feed ports, and melting the polyethylene glycol terephthalate particles with the different relative molecular mass to flow into a same casting plate from different flow channels; and stretching and cooling the melted polyethylene glycol terephthalate to obtain the flexible cover plate.

In some embodiments, an average relative molecular mass of one substrate layer close to a bending inner side of the flexible cover plate is greater than an average relative molecular mass of another substrate layer away from the bending inner side of the flexible cover plate.

In addition, an embodiment of the present disclosure provides a display device, including:

a display panel;

a flexible cover plate capable of being bent along a bending line, wherein the flexible cover plate is disposed on a side of the display panel, the flexible cover plate includes at least two substrate layers, an elastic modulus of one of two adjacent substrate layers is greater than another one of the two adjacent substrate layers, repeating structural units of corresponding materials of each substrate layer are same, the one of the two adjacent substrate layers is close to a bending inner side of the flexible cover plate, and the another one of the two adjacent substrate layers is away from the bending inner side of the flexible cover plate; and an adhesive layer disposed between the display panel and the flexible cover plate.

In some embodiments, when a bending direction of the display device is inwardly folded, the another one of the two adjacent substrate layers is disposed between the display panel and the one of the two adjacent substrate layers, the another one of the two adjacent substrate layers is away from the bending inner side of the flexible cover plate, and the one of the two adjacent substrate layers is close to a bending inner side of the flexible cover plate.

In some embodiments, when a bending direction of the display device is outwardly folded, the one of the two adjacent substrate layers is disposed between the display panel and the another one of the two adjacent substrate layers, the one of the two adjacent substrate layers is close to a bending inner side of the flexible cover plate, and the another one of the two adjacent substrate layers is away from the bending inner side of the flexible cover plate.

In some embodiments, a degree of polymerization of a corresponding material of the one of the two adjacent substrate layers is greater than a degree of polymerization of a corresponding material of the another one of the two adjacent substrate layers, the one of the two adjacent substrate layers is close to the bending inner side of the flexible cover plate, and the another one of the two adjacent substrate layers is away from the bending inner side of the flexible cover plate.

In some embodiments, the one of the two adjacent substrate layers is in direct contact with the another one of the two adjacent substrate layers, the one of the two adjacent substrate layers is close to the bending inner side of the flexible cover plate, and the another one of the two adjacent substrate layers is away from the bending inner side of the flexible cover plate.

In some embodiments, when the flexible cover plate is in a bent state, an elastic modulus of a plurality layers of the substrate layers increases progressively along a direction from the bending inner side of the flexible cover plate toward a bending outer side of the flexible cover plate.

In some embodiments, a difference between elastic modulus of the two adjacent substrate layers is less than or equal to 100 MPa.

In some embodiments, an elastic modulus of the another one of the two adjacent substrate layers away from the bending inner side of the flexible cover plate is greater than or equal to 4 GPa.

Beneficial Effects

The present disclosure provides a flexible cover plate, a manufacturing method of the flexible cover plate and a display device. The flexible cover plate is capable of being bent along a bending line. The flexible cover plate includes at least two substrate layers, an elastic modulus of one of two adjacent substrate layers is greater than another one of the two adjacent substrate layers, and repeating structural units of corresponding materials of each substrate layers are same. The one of the two adjacent substrate layers is close to a bending inner side of the flexible cover plate, and the another one of the two adjacent substrate layers is away from the bending inner side of the flexible cover plate. The present disclosure aims to make the flexible cover plate include at least two layers of substrate layers, and to make the elastic modulus of one substrate layer close to the bending inner side of the flexible cover plate greater than the elastic modulus of another substrate layer away from the bending inner side of the flexible cover plate, therefore, the bending performance of the substrate layer away from the bending inner side of the flexible cover plate is superior to that of the substrate layer close to the bending inner side of the flexible cover plate, and the surface hardness and the impact resistance of the substrate layer close to the bending inner side of the flexible cover plate are better than those of the substrate layer away from the bending inner side of the flexible cover plate. When the flexible cover plate is bonded to the display panel, a substrate layer with relatively lower elastic modulus of the flexible cover plate may be disposed on a bending outer side of the display device, improving the bending performance of the display device and avoiding the failure of the display device due to excessive bending stress, and a substrate layer with relatively higher elastic modulus may be disposed on the bending inner side of the display device, improving the surface hardness and the impact resistance of the display device, thus balancing the bending performance and the surface hardness of the display device.

DETAILED DESCRIPTION OF THE EMBODIMENTS

Figures 1, 2:
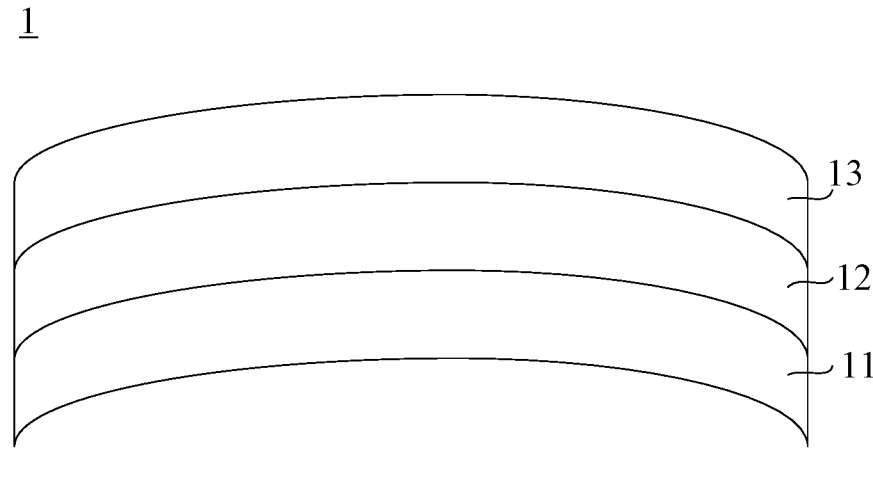
FIG. 1 is a first schematic view of a flexible cover plate provided by an embodiment of the present disclosure.
FIG. 2 is a second schematic view of the flexible cover plate provided by an embodiment of the present disclosure.

The technical solutions in the embodiments of the present disclosure may be described clearly and completely hereafter with reference to the accompanying drawings. Apparently, the described embodiments are only a part of but not all embodiments of the present disclosure. All other embodiments obtained by persons of ordinary skill in the art based on the embodiments of the present disclosure without creative efforts shall fall within the protection scope of the present disclosure.

In description of the present disclosure, it should be understood that orientational or positional relationships represented by directional terms mentioned in the present disclosure, such as central, longitudinal, lateral, length, width, thickness, up, down, front, rear, left, right, vertical, horizontal, top, bottom, inside, outside, clockwise, anticlockwise, etc., are orientational or positional relationships based on the drawings, and are merely for the convenience of describing the present disclosure and simplifying the description, rather than indicating or implying that the device or element is intended to have a particular orientation, or is constructed and operated in a particular orientation, and therefore, should not be interpreted as a limitation of the application. In addition, terms such as "first" and "second" are used herein for purposes of description, and should not be interpreted as indication or implication of relative importance, or implied indication of a number of the technical features. Therefore, features limited by terms such as "first" and "second" may explicitly or impliedly include one or more than one of these features. In description of the disclosure, "a plurality of" means two or more than two, unless otherwise specified.

In description of the present disclosure, it should be noted that, unless specified or limited otherwise, the terms "mounted," "connected," and the like are used broadly, and may be, for example, fixed connections, detachable connections, or integral connections; may also be mechanical connections, electrical connections, or communication with each other; may also be direct connections or indirect connections via intervening structures; may also be inner communications of two elements, which can be understood by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

In the embodiments of the present disclosure, a flexible cover plate and a display device are provided to alleviate the technical problem of the flexible cover plates of the prior art that is uncapable of balancing the bending performance and the surface hardness.

As shown in FIG. 1, an embodiment of the present disclosure provides a flexible cover plate which may be bent along a bending line. The flexible cover plate 1 includes at least two layers of substrate layers (such as a first substrate layer 11 and a second substrate layer 12), and among two adjacent layers of substrate layers, an elastic modulus of the substrate layer (such as the first substrate layer 11) close to a bending inner side of the flexible cover plate is greater than that of the substrate layer (such as the second substrate layer 12) away from the bending inner side of the flexible cover plate, and repeating structural units of corresponding materials of each substrate layer are the same (such as the repeating structural units of the corresponding materials of each substrate layer being polyethylene terephthalate).

The embodiment of the present disclosure provides the flexible cover plate, the flexible cover plate includes at least two layers of substrate layers, and the elastic modulus of the substrate layer close to the bending inner side of the flexible cover plate greater than the elastic modulus of the substrate layer away from the bending inner side of the flexible cover plate. Therefore, the bending performance of the substrate layer away from the bending inner side of the flexible cover plate is superior to that of the substrate layer close to the bending inner side of the flexible cover plate, and the surface hardness and the impact resistance of the substrate layer close to the bending inner side of the flexible cover plate are better than those of the substrate layer away from the bending inner side of the flexible cover plate. When the flexible cover plate is bonding to the display panel, a substrate layer with relatively lower elastic modulus of the flexible cover plate may be disposed on a bending outer side of the display device, improving the bending performance of the display device and avoiding the failure of the display device due to excessive bending stress, and a substrate layer with relatively higher elastic modulus may be disposed on the bending inner side of the display device, improving the surface hardness and the impact resistance of the display device, thus balancing the bending performance and the surface hardness of the display device.

Specifically, for the convenience of explanation, the following embodiments take the first substrate layer as the substrate layer close to the bending inner side of the flexible cover plate, and the second substrate layer as the substrate layer away from the bending inner side of the flexible cover plate as examples.

Specifically, as shown in FIG. 1, the flexible cover plate 1 includes first the substrate layer 11 and the second substrate layer 12 adjacent to each other. The first substrate layer 11 is close to the bending inner side of the flexible cover plate 1, and the second substrate layer 12 is away from the bending inner side of the flexible cover plate 1. By making the elastic modulus of the first substrate layer 11 greater than that of the second substrate layer 12, the flexible cover plate is capable of balancing the bending performance and the surface hardness of the display device.

Specifically, in the flexible cover plate of the prior art, the elastic modulus of each substrate layer in the flexible cover plate is the same, which may lead to similar or even identical performance of each substrate layer. For example, the bending performance of each substrate layer is good, but the surface hardness and the impact resistance of each substrate layer are poor, which leads to scratches or dents easily left on the flexible cover plate when using the display devices, resulting in poor appearance of the display device, and it is easy to cause damage to film layers of the display panel, leading to display failure. When the surface hardness and the impact resistance of each substrate layer are good, the bending performance of each substrate layer is poor, which leads to fracture due to bending on the flexible cover plate when using display devices, leading to display device failure. Compared with the above prior art, in the embodiment of the present disclosure, the performance of the substrate layers in different layers is different by making the elastic modulus of the substrate layers with the same repeating structural units of corresponding materials used in the flexible cover plate different from each other. Specifically, the elastic modulus of the substrate layer close to the bending inner side of the flexible cover plate is greater than that of the substrate layer away from the bending inner side of the flexible cover plate, so the surface hardness and the impact resistance of the substrate layer close to the bending inner side of the flexible cover plate are better than those of the substrate layer away from the bending inner side of the flexible cover plate, thus balancing the bending performance, the surface hardness and the impact resistance of the flexible cover plate. When the display panel is provided with the flexible cover plate, a substrate layer with relatively better bending performance of the flexible cover plate may be disposed on a bending outer side of the display device, improving the bending performance of the display device, and a substrate layer with relatively higher surface hardness and relatively better impact resistance may be disposed on the bending inner side of the display device, improving the surface hardness and the impact resistance of the display device, thus balancing the bending performance, the surface hardness and the impact resistance of the display device.

In an embodiment, a degree of polymerization of a corresponding material of the substrate layer close to the bending inner side of the flexible cover plate is greater than that of a corresponding material of the substrate layer away from the bending inner side of the flexible cover plate. By making the degree of polymerization of the corresponding material of the substrate layer close to the bending inner side of the flexible cover plate greater than that of the corresponding material of the substrate layer away from the bending inner side of the flexible cover plate, the elastic modulus of the substrate layer close to the bending inner side of the flexible cover plate greater than the elastic modulus of the substrate layer away from the bending inner side of the flexible cover plate, thereby improving the surface hardness and the impact resistance of the substrate layer close to the bending inner side of the flexible cover plate, and improving the bending performance of the substrate layer away from the bending inner side of the flexible cover plate, which allows the flexible cover plate to balance the bending performance, the surface hardness, and the impact resistance.

In an embodiment, as shown in FIG. 2, in two adjacent substrate layers, the substrate layer (such as the first substrate layer 11) close to the bending inner side of the flexible cover plate is in direct contact with the substrate layer (such as the second substrate layer 12) away from the bending inner side of the flexible cover plate. By directly contacting the substrate layer close to the bending inner side of the flexible cover plate with the substrate layer away from the bending inner side of the flexible cover plate, a thickness of the flexible cover plate is reduced, resulting in better bending performance of the flexible cover plate. Additionally, the surface hardness and the impact resistance of the substrate layer close to the bending inner side of the flexible cover plate are improved, allowing the flexible cover plate to balance the bending performance, the surface hardness, and the impact resistance.

In an embodiment, as shown in FIG. 2, when a bending direction of the flexible cover plate is inwardly folded, the flexible cover plate further includes a hardened layer 13, the hardened layer 13 is disposed on a side of the substrate layer (such as the first substrate layer 11 in FIG. 2) close to the bending inner side of the flexible cover plate, and the side is close to the bending inner side of the flexible cover plate. An elastic modulus of the hardened layer is greater than the elastic modulus of the substrate layer close to the bending inner side of the flexible cover plate. By providing the flexible cover plate with the hardened layer, and the elastic modulus of the hardened layer being greater than that of the substrate layer close to the bending inner side of the flexible cover plate, further improving the surface hardness and the impact resistance of the flexible cover plate. And by disposing the hardened layer on the side of the substrate layer which is close to the bending inner side of the flexible cover plate, and the side is close to the bending inner side of the flexible cover plate, when the flexible cover plate is inwardly folded, the bending performance of the substrate layer on a bending outer side is better, avoiding fracture due to bending of the flexible cover plate. The surface hardness and the impact resistance of the substrate layer and the hardened layer on the bending inner side are better, avoiding damage when the flexible cover plate is impacted, and balancing the bending performance, the surface hardness, and the impact resistance of the flexible cover plate.

Specifically, as shown in FIG. 2, the hardened layer 13 is located on a side of the first substrate layer 11 away from the second substrate layer 12, and the elastic modulus of the hardened layer 13 is greater than that of the first substrate layer 11. Specifically, for inwardly folded flexible cover plates, which are bent from a edge of the flexible cover plate towards a middle area of the flexible cover plate, and bent from a light entering surface towards a light-emitting surface of the flexible cover plate, the hardened layer may be disposed on the bending inner side of the flexible cover plate, the hardened layer and the substrate layer close to the bending inner side of the flexible cover plate may improve the surface hardness and the impact resistance of the flexible cover plate, and the bending performance of the substrate layer away from the bending inner side of the flexible cover plate is good, avoiding fracture caused by the poor bending performance of the substrate layer located on the bending outer side, and balancing the bending performance, the surface hardness, and the impact resistance of the flexible cover plate.

In an embodiment, as shown in FIG. 1, when the bending direction of the flexible cover plate is outwardly folded, the flexible cover plate 1 further includes a hardened layer 13, which is located on the side of the substrate layer (such as the second substrate layer 12 in FIG. 1) away from the bending inner side of the flexible cover plate 1. And the elastic modulus of the hardened layer 13 is greater than that of the substrate layer (such as the first substrate layer 11 in FIG. 1) close to the bending inner side of the flexible cover plate 1. By providing the flexible cover plate with the hardened layer, and the elastic modulus of the hardened layer being greater than that of the substrate layer close to the bending inner side of the flexible cover plate, further improving the surface hardness and the impact resistance of the flexible cover plate. And by disposing the hardened layer on the side of the substrate layer which is away from the bending inner side of the flexible cover plate, and the side is away from the bending inner side of the flexible cover plate, when the flexible cover plate is outwardly folded, the bending performance of the substrate layer on a bending outer side is better, avoiding fracture due to bending of the flexible cover plate. The surface hardness and the impact resistance of the hardened layer on the bending inner side are better, avoiding damage when the flexible cover plate is impacted, and balancing the bending performance, the surface hardness, and the impact resistance of the flexible cover plate.

Specifically, as shown in FIG. 1, the hardened layer 13 is disposed on a side of the second substrate layer 12 away from the first substrate layer 11, and the elastic modulus of the hardened layer 13 is greater than that of the first substrate layer 11. Specifically, for outwardly folded flexible cover plates, which are bent from the middle area of the flexible cover plate towards the edge of the flexible cover plate, and bent from the light-emitting surface towards the light entering surface of the flexible cover plate, the hardened layer may be disposed on the bending outer side of the flexible cover plate, the hardened layer may improve the surface hardness and the impact resistance of the flexible cover plate, and the bending performance of the substrate layer away from the bending inner side of the flexible cover plate is good, avoiding fracture caused by the poor bending performance of the substrate layer located on the bending outer side. The surface hardness and the impact resistance of the substrate layer away from the bending inner side of the flexible cover plate is good, further improving the surface hardness and the impact resistance of the flexible cover plate, avoiding damage when the flexible cover plate is impacted, and balancing the bending performance, the surface hardness, and the impact resistance of the flexible cover plate.

Specifically, a thickness of the hardened layer ranges from 3 microns to 20 microns, which may avoid the possibility of a small thickness of the hardened layer leading to low surface hardness and poor scratch resistance, as well as the possibility of a large thickness of the hardened layer leading to poor bending performance. This allows the hardened layer to balance the bending performance, the surface hardness, and the impact resistance.

Specifically, materials of the hardened layer include silicone oil based materials, acrylic based materials, or a mixture of both.

In response to the problem of excessive performance difference between the first substrate layer and the second substrate layer, which may lead to stress mutation and cause film layer fracture and failure, in an embodiment, when the flexible cover plate is in a bent state, the elastic modulus of the plurality of substrate layers increases along the direction from the bending outer side of the flexible cover plate toward the bending inner side of the flexible cover plate. By increasing the elastic modulus of the plurality of substrate layers along the direction from the bending outer side of the flexible cover plate toward the bending inner side of the flexible cover plate, the change in elastic modulus between adjacent substrate layers may be minimized, avoiding stress mutations that may cause film layer fracture and failure.

Figure 3:
FIG. 3 is a third schematic view of the flexible cover plate provided by an embodiment of the present disclosure.

In an embodiment, as shown in FIG. 3, the flexible cover plate 1 further includes a third substrate layer 14, which is made of the same material as the second substrate layer 12. The third substrate layer 14 is disposed on a side of the second substrate layer 12 away from the first substrate layer 11, and an elastic modulus of the third substrate layer 14 is smaller than that of the second substrate layer 12. By disposing the third substrate layer in the flexible cover plate, the material of the third substrate layer being the same as that of the second substrate layer, the third substrate layer being disposed on the side of the second substrate layer away from the first substrate layer, and the elastic modulus of the third substrate layer being smaller than that of the second substrate layer, the elastic modulus from the first substrate layer toward the third substrate layer may be gradually reduced, resulting in a smaller difference in elastic modulus between adjacent substrate layers, avoiding sudden stress changes during the bending of the flexible cover plate, which may cause film layer fracture and failure, and improving the stability of the flexible cover plate.

Specifically, by making the elastic modulus of the third substrate layer smaller than that of the second substrate layer, when the flexible cover plate is provided, the difference in elastic modulus between adjacent substrate layers may be reduced, and the performance difference between adjacent substrate layers is small. Taking the third substrate layer disposed on the bending outer side as an example, the first substrate layer has the highest surface hardness and impact resistance, and the third substrate layer has the best bending performance. The surface hardness of the second substrate layer is lower than that of the first substrate layer, and the surface hardness of the second substrate layer is higher than that of the third substrate layer. The impact resistance of the second third substrate layer is lower than that of the first substrate layer, and the impact resistance of the second substrate layer is better than that of the third substrate layer. The bending performance of the second substrate layer is lower than that of the third substrate layer, and the bending performance of the second substrate layer is better than that of the first substrate layer, resulting in a small performance difference between adjacent substrate layers. In addition, the performance of the substrate layers located on the bending outer and the bending inner sides is different, allowing the flexible cover plate to balance the bending performance, the surface hardness, and the impact resistance.

Specifically, in FIG. 3, take the third substrate layer 14 disposed on a side of the second substrate layer 12 away from the hardened layer 13 as an example for explanation, but the embodiments of the present disclosure are not limited to this. For example, the third substrate layer may be disposed between the second substrate layer and the hardened layer.

Specifically, the above embodiment takes the flexible cover plate including the first substrate layer, the second substrate layer, and the third substrate layer as an example for explanation. But the present disclosure is not limited to this, for example, a fourth substrate layer, a fifth substrate layer, etc. may further be disposed.

In response to the problem of excessive performance differences between adjacent substrate layers, which may lead to stress mutations resulting in film layer fracture and failure. In an embodiment, the difference of elastic modulus between adjacent substrate layers is less than or equal to 100 megapascals, which may avoid excessive differences in elastic modulus between adjacent film layers, causing stress mutations leading to film layer fracture and failure during the bending, and improving the stability of flexible cover plates.

Specifically, taking the substrate layers including the first substrate layer and the second substrate layer as an example, when the first substrate layer and the second substrate layer are bonded, the difference of the elastic modulus between the first substrate layer and the second substrate layer may be less than or equal to 100 megapascals.

Specifically, for example, if the elastic modulus of the first substrate layer is 4 gigapascals, the elastic modulus of the second substrate layer may be 3.9 gigapascals.

Specifically, the elastic modulus of the substrate layer away from the bending inner side of the flexible cover plate is greater than or equal to 4 Gpa (gigapascals), which makes various substrate layers of the flexible cover plate may meet requirement of the surface hardness and the impact resistance performance of the flexible cover plate during use, avoiding low surface hardness and poor impact resistance of flexible cover plates. In an embodiment, a material of the substrate layer includes polyethylene terephthalate.

In an embodiment, the thickness of the substrate layer is greater than or equal to 10 microns, which brings the substrate layer with a certain surface hardness and the impact resistance, avoiding the possibility of damage and failure due to the thickness of the substrate layer being too small.

Specifically, the thickness of the first substrate layer is greater than or equal to 10 microns, which brings the first substrate layer with a certain surface hardness and the impact resistance, avoiding the possibility of damage and failure due to the thickness of the first substrate layer being too small.

Specifically, the thickness of the second substrate layer is greater than or equal to 10 microns, which brings the second substrate layer with a certain surface hardness and the impact resistance, avoiding the possibility of damage and failure due to the thickness of the second substrate layer being too small.

Specifically, the above embodiments explain the thickness of the first and second substrate layers, but the embodiments of the present disclosure are not limited to this. For example, when the flexible cover plate includes the third substrate layer, the thickness of the third substrate layer may be greater than or equal to 10 microns.

In an embodiment, the thickness of the flexible cover plate ranges from 20 microns to 200 microns, to avoid poor bending performance caused by excessive thickness of the flexible cover plate, and to avoid poor surface hardness and impact resistance caused by too thin thickness of the flexible cover plate, balancing the bending performance, the surface hardness, and the impact resistance of the flexible cover plate.

Figure 4:
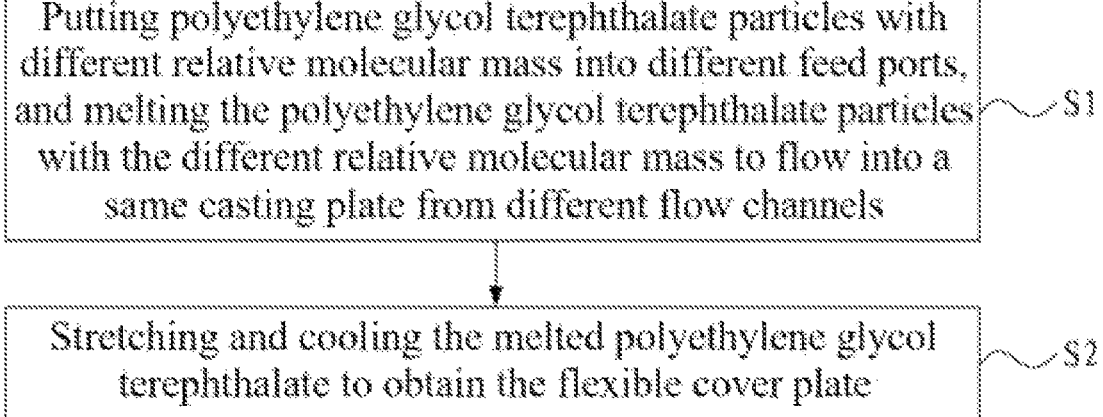
FIG. 4 is a flowchart of a manufacturing method of the flexible cover plate provided by an embodiment of the present disclosure.

In addition, the embodiment of the present disclosure provides a manufacturing method of a flexible cover plate, as shown in FIG. 4. The manufacturing method of the flexible cover plate is used to manufacture a flexible cover plate as described in any of the above embodiments. The manufacturing method of the flexible cover plate includes:

S1, putting polyethylene glycol terephthalate particles with different relative molecular mass into different feed ports, and melting the polyethylene glycol terephthalate particles with the different relative molecular mass to flow into a same casting plate from different flow channels; and S2, stretching and cooling the melted polyethylene glycol terephthalate to obtain the flexible cover plate.

The embodiment of the present disclosure provides the manufacturing method of the flexible cover plate. The flexible cover plate manufactured by the manufacturing method of the flexible cover plate includes at least two substrate layers, the elastic modulus of the substrate layer close to the bending inner side of the flexible cover plate is greater than the elastic modulus of the substrate layer away from the bending inner side of the flexible cover plate, so the bending performance of the substrate layer away from the bending inner side of the flexible cover plate is superior to that of the substrate layer close to the bending inner side of the flexible cover plate, and the surface hardness and the impact resistance of the substrate layer close to the bending inner side of the flexible cover plate are better than those of the substrate layer away from the bending inner side of the flexible cover plate. When the flexible cover plate is bonded to the display panel, a substrate layer with relatively lower elastic modulus of the flexible cover plate may be disposed on a bending outer side of the display device, improving the bending performance of the display device and avoiding the failure of the display device due to excessive bending stress, and a substrate layer with relatively higher elastic modulus may be disposed on the bending inner side of the display device, improving the surface hardness and the impact resistance of the display device, thus balancing the bending performance and the surface hardness of the display device.

Figure 5:
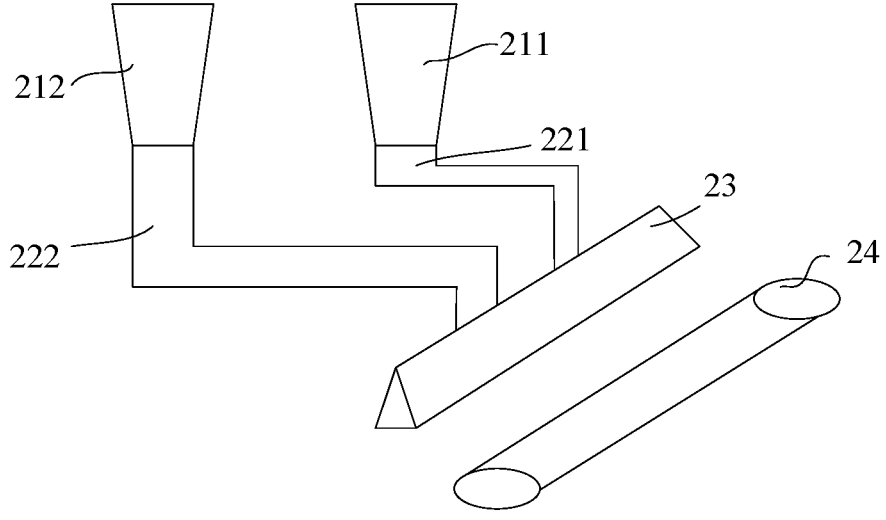
FIG. 5 is a schematic view of a preparation device for the flexible cover plate provided by an embodiment of the present disclosure.

Specifically, as shown in FIG. 5, taking the preparation device for the flexible cover plate shown in FIG. 5 as an example, the preparation device for the flexible cover plate includes a first feeding port 211, a second feeding port 212, a first flow channel 221, a second flow channel 222, a casting plate 23, and a stretching unit 24. When preparing the flexible cover plate, polyethylene terephthalate particles with relative molecular masses ranging from 24000 to 26000 may be added to the first feeding port 211 for melting, and polyethylene terephthalate particles with relative molecular masses ranging from 22000 to 24000 may be added to the second feeding port 212 for melting, so that polyethylene terephthalate particles with the relative molecular masses ranging from 22000 to 24000 flow out of the first flow channel 221 after melting, and polyethylene terephthalate particles with the relative molecular masses ranging from 22000 to 24000 flow out of the second flow channel 222 after melting. Polyethylene terephthalate with different relative molecular masses converge together, and stretch the molten polyethylene terephthalate by the stretching unit 24 to obtain the first substrate layer and the second substrate layer.

Specifically, when stretching the molten polyethylene terephthalate, both transverse and longitudinal stretching may be performed to form a polyethylene terephthalate film.

Specifically, when obtaining polyethylene terephthalate particles with different relative molecular masses, the polyethylene terephthalate particles are generated by polycondensation reaction and granulation between terephthalic acid and ethylene glycol. During the preparation process, the polymerization degree is capable of being controlled by adjusting ratio of reaction materials, reaction temperature, reaction time, and vacuum degree to obtain polyethylene terephthalate particles with different relative molecular masses. And the relative molecular mass of polyethylene terephthalate particles may be controlled ranging from 20000 to 30000.

Specifically, the hardened layer may be formed by coating silicone oil based materials on the first substrate layer to further improve the bending performance, the surface hardness, and the scratch resistance of the flexible cover plate.

In an embodiment, the average relative molecular mass of the substrate layer close to the bending inner side of the flexible cover plate is greater than the average relative molecular mass of the substrate layer away from the bending inner side of the flexible cover plate, which brings the elastic modulus of the substrate layer formed close to the bending inner side of the flexible cover plate greater than the elastic modulus of the substrate layer away from the bending inner side of the flexible cover plate. Therefore, when the flexible cover plate is bonded to the display panel, the substrate layer with relatively lower elastic modulus of the flexible cover plate may be disposed on the bending outer side of the display device, improving the bending performance of the display device and avoiding the failure of the display device due to excessive bending stress. The substrate layer with relatively higher elastic modulus may be disposed on the bending inner side of the display device, improving the surface hardness and the impact resistance of the display device, thereby balancing the bending performance and the surface hardness of the display device.

Specifically, the average relative molecular mass of the first substrate layer is greater than the average relative molecular mass of the second substrate layer.

In an embodiment, the relative molecular mass of the first substrate layer ranges from 24000 to 30000, which enables the first substrate layer to meet requirement of the surface hardness and the impact resistance of the flexible cover plate during use, avoiding lower surface hardness and poor impact resistance of the flexible cover plate.

Specifically, if the relative molecular mass of the first substrate layer ranges from 24000 to 30000, the average relative molecular mass of the first substrate layer may range from 24000 to 30000, which enables the first substrate layer to meet requirement of the surface hardness and the impact resistance of the flexible cover plate during use, avoiding lower surface hardness and poor impact resistance of the flexible cover plate.

Specifically, if the relative molecular mass of the first substrate layer ranges from 24000 to 26000, the average relative molecular mass of the first substrate layer may range from 24000 to 26000, which enables the first substrate layer to meet requirement of the surface hardness and the impact resistance of the flexible cover plate during use, avoiding lower surface hardness and poor impact resistance of the flexible cover plate.

In an embodiment, the relative molecular mass of the second substrate layer may ranges from 22000 to 24000, which improves the bending performance of the second substrate layer. Additionally, a difference in relative molecular mass between the second substrate layer and the first substrate layer is relatively small, avoiding excessive differences in elastic modulus between the adjacent film layers that may cause stress mutations when the flexible cover plate is bent, and leading to the problem of film layer fracture and failure.

Specifically, if the relative molecular mass of the second substrate layer ranges from 22000 to 24000, the average relative molecular mass range of the second substrate layer may range from 22000 to 24000, which improves the bending performance of the second substrate layer and brings the second substrate layer a certain surface hardness and impact resistance, thereby improving the flexibility of the flexible cover plate.

Specifically, the above embodiments explain the relative molecular mass of the first and second substrate layers, but the embodiments of the present disclosure are not limited to this. For example, when there is a third substrate layer, the relative molecular mass of the third substrate layer may range from 20000 to 24000.

In an embodiment, the difference in the average relative molecular mass between the first substrate layer and the second substrate layer ranges from 1 to 2000, which makes the performance difference between the first substrate layer and the second substrate layer minimized, avoiding excessive difference in elastic modulus between the adjacent film layers that may cause stress mutations leading to film layer fracture failure during bending, and improving the stability of the flexible cover plate.

Specifically, for example, if the average relative molecular mass of the first substrate layer is 25000, the average relative molecular mass of the second substrate layer is 23000, which reduces the difference in elastic modulus between the adjacent substrate layers and avoids excessive differences in elastic modulus between the adjacent substrate layers, leading to stress mutation during bending and film layer fracture failure, thereby improving the stability of the flexible cover plate.

In addition, the embodiments of the present disclosure provide a display device, which includes the flexible cover plate as described in any of the above embodiments.

Figure 6:
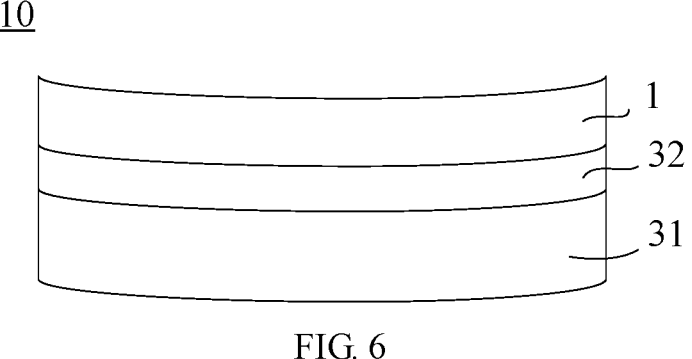
FIG. 6 is a first schematic view of a display device provided by an embodiment of the present disclosure.
Figure 7:
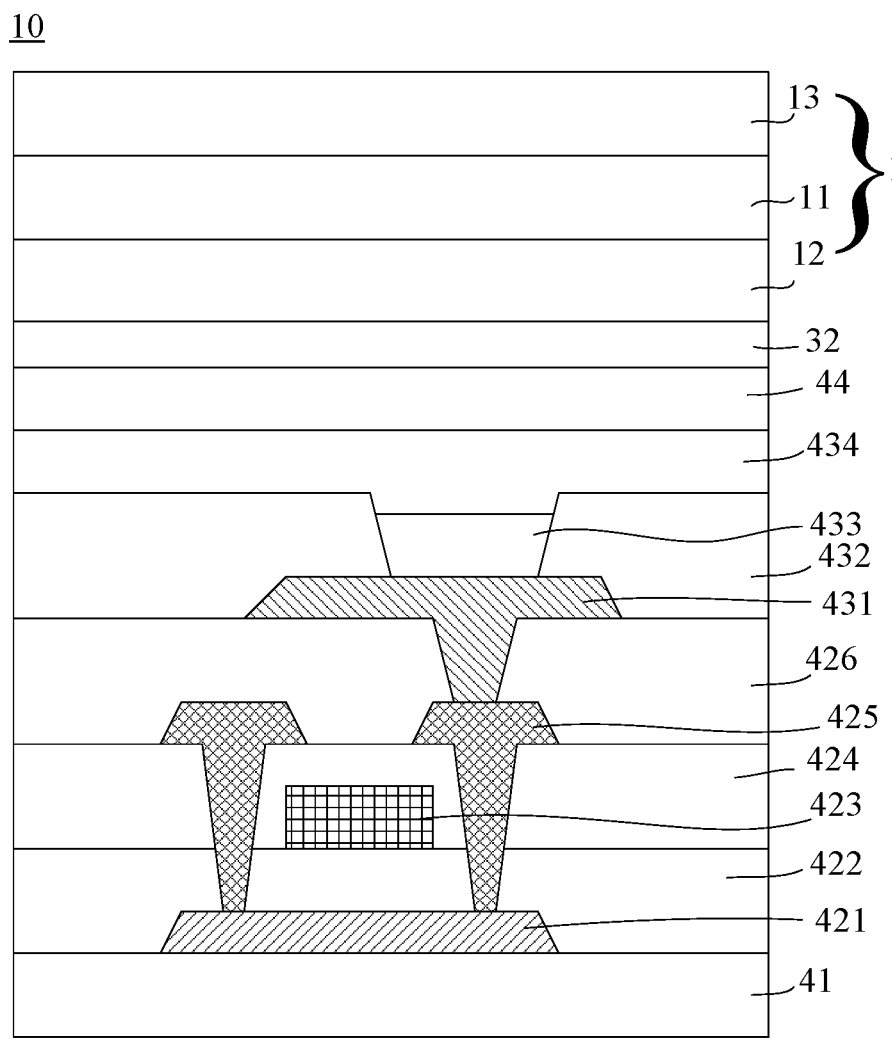
FIG. 7 is a second schematic view of the display device provided by an embodiment of the present disclosure.

As shown in FIGS. 6 and 7, the embodiments of the present disclosure provide a display device. The display device includes:

a display panel 31;

the flexible cover plate 1 which may be bent along a bending line, including at least two layers of substrate layers (such as a first substrate layer 11 and a second substrate layer 12), among two adjacent layers of substrate layers, an elastic modulus of the substrate layer (such as the first substrate layer 11) close to a bending inner side of the flexible cover plate being greater than that of the substrate layer (such as the second substrate layer 12) away from the bending inner side of the flexible cover plate, and repeating structural units of corresponding materials of each substrate layer being the same; and an adhesive layer disposed between the display panel and the flexible cover plate.

The embodiment of the present disclosure provides the display device, and the display device includes the display panel, the flexible cover plate and the adhesive layer. The flexible cover plate includes at least two layers of substrate layers, and the elastic modulus of the substrate layer close to the bending inner side of the flexible cover plate greater than the elastic modulus of the substrate layer away from the bending inner side of the flexible cover plate. Therefore, the bending performance of the substrate layer away from the bending inner side of the flexible cover plate is superior to that of the substrate layer close to the bending inner side of the flexible cover plate, and the surface hardness and the impact resistance of the substrate layer close to the bending inner side of the flexible cover plate are better than those of the substrate layer away from the bending inner side of the flexible cover plate. When the flexible cover plate is bonding to the display panel, a substrate layer with relatively lower elastic modulus of the flexible cover plate may be disposed on a bending outer side of the display device, improving the bending performance of the display device and avoiding the failure of the display device due to excessive bending stress, and a substrate layer with relatively higher elastic modulus may be disposed on the bending inner side of the display device, improving the surface hardness and the impact resistance of the display device, thus balancing the bending performance and the surface hardness of the display device.

In an embodiment, the bending line of the flexible cover plate is the same as the bending line of the display device.

In an embodiment, as shown in FIG. 7, when a bending direction of the flexible cover plate is inwardly folded, the substrate layer (such as the second substrate layer 12) away from the bending inner side of the flexible cover plate is disposed between the display panel and the substrate layer (such as the first substrate layer 11) close to the bending inner side of the flexible cover plate, which ensures that the substrate layer with lower elastic modulus is located on the bending outer side of the display device, improving the bending performance of the display device, and the substrate layer with higher elastic modulus is located on the bending inner side of the display device, improving the surface hardness and the impact resistance of the display device, and balancing the bending performance, the surface hardness, and the impact resistance of the display device.

Specifically, as shown in FIGS. 6 and 7, take an inward bending type display device as an example for explain, the display device is bend from the display panel towards the flexible cover plate, resulting in greater stress on the bending outer side. Therefore, the substrate layer with lower elastic modulus provided by the embodiment of the present disclosure is disposed on the bending outer side, to ensure a better bending performance of the film layer located on the bending outer side, avoiding excessive bending stress causing the display device to fail. At the same time, the surface hardness and the impact resistance of the substrate layer located on the bending inner side are good, which may improve the surface hardness and the impact resistance of the display device, balancing the bending performance, the surface hardness, and the impact resistance of the display device.

Specifically, as shown in FIG. 7, to further improve the surface hardness and the impact resistance, a side of the second substrate layer 12 away from the first substrate layer 11 may be provided with a hardened layer 13.

Figure 9:
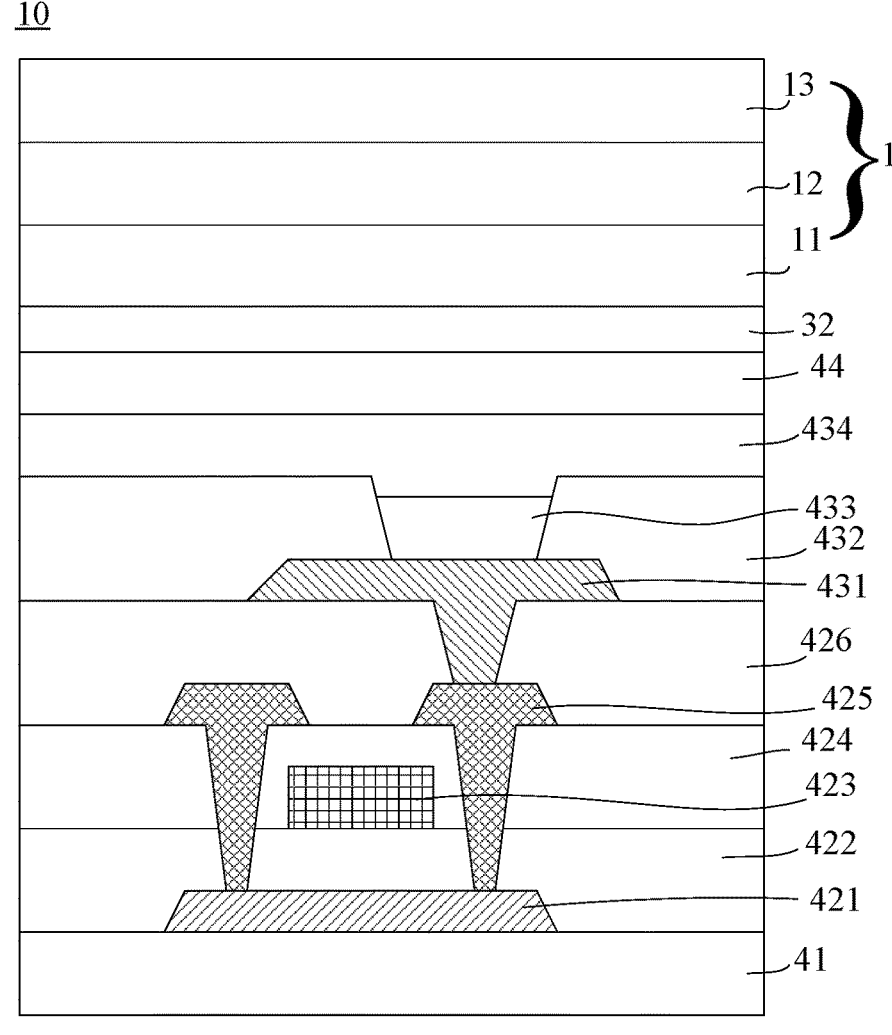
FIG. 9 is a fourth schematic view of the display device provided by an embodiment of the present disclosure.

In an embodiment, as shown in FIG. 9, when the bending direction of the display device is outwardly folded, the substrate layer (such as the first substrate layer 11) close to the bending inner side of the flexible cover plate 1 is disposed between the display panel and the substrate layer (such as the second substrate layer 12) away from the bending inner side of the flexible cover plate 1. By the substrate layer close to the bending inner side of the flexible cover plate being disposed between the display panel and the substrate layer away from the bending inner side of the flexible cover plate, when the display device is outwardly folded, the substrate layer with lower elastic modulus may be disposed on the bending outer side of the display device, improving the bending performance, and the substrate layer with higher elastic modulus may be disposed on the bending inner side of the display device, improving the surface hardness and the impact resistance of the display device, and balancing the bending performance, the surface hardness, and the impact resistance of the display device.

Figure 8:
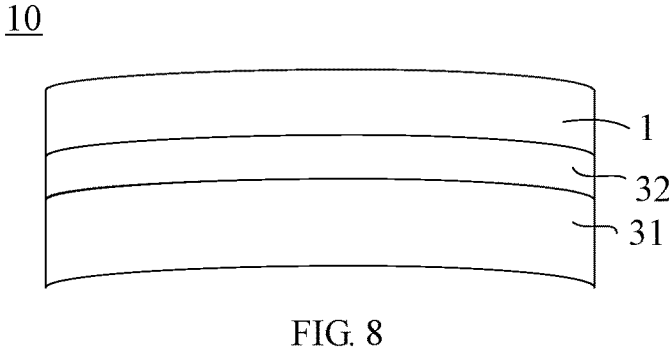
FIG. 8 is a third schematic view of the display device provided by an embodiment of the present disclosure.

Specifically, as shown in FIGS. 8 and 9, take an outward bending type display device as an example for explain, the display device is bend from the flexible cover plate towards the display panel, resulting in greater stress on the bending outer side. Therefore, the substrate layer with lower elastic modulus provided by the embodiment of the present disclosure is disposed on the bending outer side, to ensure a better bending performance of the film layer located on the bending outer side, avoiding excessive bending stress causing the display device to fail. At the same time, the surface hardness and the impact resistance of the substrate layer located on the bending inner side are good, which may improve the surface hardness and the impact resistance of the display device, balancing the bending performance, the surface hardness, and the impact resistance of the display device.

The above embodiments are explained by taking the display device as an inward folded display device or an outward folded display device as an example. But the embodiments of the present disclosure are not limited to this. For example, the display device may bend inward and outward during use. The plurality of substrate layers are provided by the embodiments of the present disclosure, such as the first substrate layer and the second substrate layer, to improve the surface hardness and impact resistance of the display device by the first substrate layer, and to improve the bending performance of the display device by the second substrate layer. So that when the display device is bent inward or outward, there would be no problem of bending failure, balancing the bending performance, the surface hardness, and the impact resistance of the display device.

Specifically, as shown in FIG. 7, the display panel includes a substrate 41, a driving circuit layer, a light-emitting functional layer, and an encapsulation layer 44 disposed in sequence.

Specifically, as shown in FIG. 7, the driving circuit layer includes an active layer 421, a gate insulation layer 422, a gate layer 423, an interlayer insulation layer 424, a source drain layer 425, and a planarization layer 426 disposed in sequence.

Specifically, as shown in FIG. 7, the light-emitting functional layer includes a pixel electrode layer 431, a pixel definition layer 432, a light-emitting material layer 433, and a common electrode layer 434 disposed in sequence.

Specifically, the above embodiments take the driving circuit layer with the gate disposed on the active layer as an example for explain, but the embodiments of the present disclosure are not limited to this. For example, the gate may be disposed under the active layer, the driving circuit layer may include a first metal layer and a second metal layer, the first metal layer includes the gate, and the second metal layer including a capacitor plate; In another example, the driving circuit layer may include at least one of low-temperature polycrystalline silicon thin film transistors, oxide thin film transistors, and low-temperature polycrystalline oxide thin film transistors.

According to the above embodiments, it may be obtained that:

the embodiments of the present disclosure provide the flexible cover plate, the manufacturing method of the flexible cover plate and the display device. The flexible cover plate is capable of being bent along a bending line. The flexible cover plate includes at least two substrate layers, an elastic modulus of the substrate layer close to a bending inner side of the flexible cover plate is greater than the substrate layer away from the bending inner side of the flexible cover plate, and repeating structural units of corresponding materials of various substrate layers are same. The present disclosure aims to make the flexible cover plate include at least two layers of substrate layers, and to make the elastic modulus of one substrate layer close to the bending inner side of the flexible cover plate greater than the elastic modulus of another substrate layer away from the bending inner side of the flexible cover plate, therefore, the bending performance of the substrate layer away from the bending inner side of the flexible cover plate is superior to that of the substrate layer close to the bending inner side of the flexible cover plate, and the surface hardness and the impact resistance of the substrate layer close to the bending inner side of the flexible cover plate are better than those of the substrate layer away from the bending inner side of the flexible cover plate. When the flexible cover plate is bonded to the display panel, a substrate layer with relatively lower elastic modulus of the flexible cover plate may be disposed on a bending outer side of the display device, improving the bending performance of the display device and avoiding the failure of the display device due to excessive bending stress, and a substrate layer with relatively higher elastic modulus may be disposed on the bending inner side of the display device, improving the surface hardness and the impact resistance of the display device, thus balancing the bending performance and the surface hardness of the display device.

In the foregoing embodiments, the description of each of the embodiments has respective focuses. For a part that is not described in detail in an embodiment, reference may be made to relevant descriptions in other embodiments. Details are not further described herein.

The flexible cover plate, the manufacturing method of the flexible cover plate and the display device provided in the embodiments of the present disclosure are described in detail above. The principle and implementations of the present disclosure are described in this specification by using specific examples. The description about the foregoing embodiments is merely provided to help understand the technical solutions and core ideas of the present disclosure. Persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A flexible cover plate, wherein the flexible cover plate is capable of being bent along a bending line, the flexible cover plate comprises a first substrate layer and a second substrate layer adjacent to each other, the first substrate layer is close to a bending inner side of the flexible cover plate, the second substrate layer is away from the bending inner side of the flexible cover plate, an elastic modulus of the first substrate layer is greater than an elastic modulus of the second substrate layer, and repeating structural units of corresponding materials of the first substrate layer and the second substrate layer are same.

2. The flexible cover plate of claim 1, wherein a degree of polymerization of a corresponding material of the first substrate layer is greater than a degree of polymerization of a corresponding material of the second substrate layer.

3. The flexible cover plate of claim 1, wherein the first substrate layer is in direct contact with the second substrate layer.

4. The flexible cover plate of claim 1, wherein when a bending direction of the flexible cover plate is inwardly folded, the flexible cover plate further comprises a hardened layer, the hardened layer is disposed on a side of the first substrate layer close to the bending inner side of the flexible cover plate, an elastic modulus of the hardened layer is greater than the elastic modulus of the first substrate layer.

5. The flexible cover plate of claim 1, wherein when a bending direction of the flexible cover plate is outwardly folded, the flexible cover plate comprises a hardened layer, and the hardened layer is disposed on a side of the second substrate layer away from the bending inner side of the flexible cover plate, an elastic modulus of the hardened layer is greater than the elastic modulus of the first substrate layer.

6. The flexible cover plate of claim 1, wherein when the flexible cover plate is in a bent state, an elastic modulus of a plurality layers of substrate layers increases progressively along a direction from the bending inner side of the flexible cover plate toward a bending outer side of the flexible cover plate.

7. The flexible cover plate of claim 6, wherein a difference between elastic modulus of adjacent substrate layers is less than or equal to 100 MPa.

8. The flexible cover plate of claim 1, wherein an elastic modulus of the second substrate layer is greater than or equal to 4 GPa.

9. The flexible cover plate of claim 1, wherein a thickness of a substrate layer is greater than or equal to 10 microns.

10. The flexible cover plate of claim 1, wherein a thickness of the flexible cover plate ranges from 20 microns to 200 microns.

11. A manufacturing method of a flexible cover plate, wherein the flexible cover plate is capable of being bent along a bending line, the flexible cover plate comprises a first substrate layer and a second substrate layer adjacent to each other, the first substrate layer is close to a bending inner side of the flexible cover plate, the second substrate layer is away from the bending inner side of the flexible cover plate, an elastic modulus of the first substrate layer is greater than an elastic modulus of the second substrate layer, and repeating structural units of corresponding materials of the first substrate layer and the second substrate layer are same, and the manufacturing method of the flexible cover plate comprises:

putting polyethylene glycol terephthalate particles with different relative molecular mass into different feed ports, and melting the polyethylene glycol terephthalate particles with the different relative molecular mass to flow into a same casting plate from different flow channels; and stretching and cooling the melted polyethylene glycol terephthalate to obtain the flexible cover plate.

12. The manufacturing method of claim 11, wherein an average relative molecular mass of the first substrate layer is greater than an average relative molecular mass of the second substrate layer.

13. A display device, comprising:

a display panel;

a flexible cover plate capable of being bent along a bending line, wherein the flexible cover plate is disposed on a side of the display panel, the flexible cover plate comprises a first substrate layer and a second substrate layer adjacent to each other, the first substrate layer is close to a bending inner side of the flexible cover plate, the second substrate layer is away from the bending inner side of the flexible cover plate, an elastic modulus of the first substrate layer is greater than the second substrate layer, and repeating structural units of corresponding materials of the first substrate layer and the second substrate layer are same; and an adhesive layer disposed between the display panel and the flexible cover plate.

14. The display device of claim 13, wherein when a bending direction of the display device is inwardly folded, the second substrate layer is disposed between the display panel and the first substrate layer.

15. The display device of claim 13, wherein when a bending direction of the display device is outwardly folded, the first substrate layer is disposed between the display panel and the second substrate layer.

16. The display device of claim 13, wherein a degree of polymerization of a corresponding material of the first substrate layer is greater than a degree of polymerization of a corresponding material of the second substrate layer.

17. The display device of claim 13, wherein the first substrate layer is in direct contact with the second substrate layer.

18. The display device of claim 13, wherein when the flexible cover plate is in a bent state, an elastic modulus of a plurality layers of substrate layers increases progressively along a direction from the bending inner side of the flexible cover plate toward a bending outer side of the flexible cover plate.

19. The display device of claim 18, wherein a difference between elastic modulus of adjacent substrate layers is less than or equal to 100 MPa.

20. The display device of claim 13, wherein an elastic modulus of the second substrate layer is greater than or equal to 4 GPa.

\* \* \* \* \*